United States Patent [19]
Al-Khairi

[11] Patent Number: 5,410,683
[45] Date of Patent: Apr. 25, 1995

[54] PROGRAMMABLE DIVIDER EXHIBITING A 50/50 DUTY CYCLE

[75] Inventor: Samer Al-Khairi, Phoenix, Ariz.

[73] Assignee: INTEL Corporation, Santa Clara, Calif.

[21] Appl. No.: 284,259

[22] Filed: Aug. 2, 1994

Related U.S. Application Data

[62] Division of Ser. No. 121,289, Sep. 14, 1993.

[51] Int. Cl.⁶ .............................................. G06F 1/08
[52] U.S. Cl. .................................. 395/550; 377/39; 377/47; 327/294
[58] Field of Search .............. 377/39, 47; 395/550; 328/61

[56] References Cited

U.S. PATENT DOCUMENTS

| | | | |
|---|---|---|---|
| 3,878,370 | 4/1975 | Santomango et al. | 377/39 |
| 4,785,415 | 11/1988 | Karlquist | 395/550 |
| 4,805,199 | 2/1989 | Muramatsu | 377/39 |
| 5,221,906 | 6/1993 | Hayashi et al. | 328/61 |
| 5,345,489 | 9/1994 | Saitoh | 377/39 |

Primary Examiner—John S. Heyman
Attorney, Agent, or Firm—Blakely, Sokoloff, Taylor & Zafman

[57] ABSTRACT

A programmable clock divider in which a system reference clock signal is divided by a programmed integer value. A storage register stores a value equal to the desired divisor minus two. A stored value of zero results in a divide by two. The stored value is loaded into a compare register and a counter is implemented to count reference clock signals. The compare register value and the counter value are compared by a comparator logic circuit. When the two values are equal, a flip-flop is toggled to switch the prescale clock value output. The flip-flop control logic includes circuitry for ensuring that odd divides exhibit an output clock frequency having a 50/50 duty cycle by controlling the flip-flop toggle to coincide with system clock edges. The flip-flop control logic also controls the timing for loading and resetting the compare and counter logic, respectively.

4 Claims, 5 Drawing Sheets

PROGRAMMABLE DIVIDER EXHIBITING A 50/50 DUTY CYCLE

This is a divisional of application Ser. No. 08/121,289, filed Sep. 14, 1993.

BACKGROUND OF THE INVENTION

1. Field of the Invention

The present invention relates to circuitry for use in electronic systems having components operating in multiple time domains. More particularly, the present invention relates to circuitry for generating clock signals of varying frequency for use by different components within processor systems.

2. Art Background

Computer systems and other microprocessor controlled systems are generally divided into a group of components. These components are generally driven by a common "clock" or signal line carrying a signal that varies at a predetermined frequency. The phases of the clock signal are used for sequencing logic in integrated circuits, as well as for enabling memory arrays and other components in a computer system. The clock signal is provided to the various components in the computer system and components typically carry out their operation or set of operations during one or more clock cycles.

In the past, it has been quite common for all the components of the computer system to be driven by the same clock reference signal. This has required that computer designers design computer systems around a target operating clock frequency. Systems designed to operate at a single clock frequency are difficult to upgrade with components that operate at different clock frequencies. In order to accommodate faster or slower components while still supporting the "standard" components, modifications are required for the clock generation hardware. Modifying the clocking hardware results in additional expense to upgrade, less design reuse and longer time periods between design and marketing.

In those computer and microprocessor controlled systems where some components operate with faster clock cycles than others, the hardware that propagates the reference clock signal to the components have had to be sensitive to introducing a clock skew. Skew refers to the phase difference between the reference clock and the clock signal seen by each of the components. These offsets may occur due to propagation delays in the circuitry. As clock frequencies increase, the allowable error margin to account for skew decreases. Frequency multiplication is traditionally performed using a simple and well-known circuit which utilizes a phase locked loop (PLL). A basic frequency multiplier using a PLL is described in Horowitz & Hill, *The Art of Electronics*, 2d ed. Cambridge University Press, 1989, p. 647. Such a circuit can generate only whole multiples of the input clock frequency, thereby not accounting for secondary clock frequencies which are not integer multiples of the reference clock.

In those computer and microprocessor systems where it is necessary that some components or peripherals be operated at slower clock frequencies than the reference clock, traditional division circuits have generally been limited to division by even integers and are usually hardwired for a specific division value. Additionally, these dividers have not always produced output clock signal exhibiting the desired 50/50 duty cycle.

Division by odd integers have been problematic in that timing control to ensure clock edge alignment is difficult. One solution that has been used to perform odd division has been to double of the frequency using the multiplication scheme described above and then dividing by twice the value of the desired odd divisor. The problem with this implementation is that the divisor then must utilize a phase locked loop or other analog circuitry which can add great expense and complexity to an otherwise digital circuit. Further, introducing analog circuitry such as phase locked loops into an integrated circuit increases the expense of development and debug time for the circuit.

Today's highly integrated systems find the need for using a number of different clocking speeds to satisfy all of the components and peripherals involved. It would be advantageous, and is therefore an object of the present invention, to develop a programmable divider that is capable of performing even and odd divisions as well as being able to provide an output clock signal that exhibits a 50/50 duty cycle.

SUMMARY OF THE INVENTION

From the foregoing it can be appreciated that there is a need to provide clock signals at predetermined divided values of most system's standard reference clock rate. It is therefore an object of the present invention to provide a method and apparatus for dividing a given reference clock frequency by a programmable divisor.

It is also an object of the present invention to provide for the division of a reference clock signal by both odd and even divisor values.

Another object of the present invention is to provide an output divided clock signal exhibiting nearly a 50/50 duty cycle characteristic.

It is another object of the present invention to provide a programmable divider that does not rely on analog circuitry to perform odd division.

These and other objects of the present invention are provided by a programmable clock divider in which a system reference clock signal is divided by a programmed integer value. A storage register stores a value equal to the desired divisor minus two. A stored value of zero results in a divide by two. The stored value is loaded into a compare register and a counter is implemented to count reference clock signals. The compare register value and the counter value are compared by a comparator logic circuit. When the two values are equal, a flip-flop is toggled to switch the prescale clock value output. The flip-flop control logic includes circuitry for ensuring that odd divides exhibit an output clock frequency having a 50/50 duty cycle by controlling the flip-flop toggle to coincide with system clock edges. The switching of the flip-flop also controls the loading and resetting of the compare and counter logic, respectively, to occur in a timely manner.

BRIEF DESCRIPTION OF THE DRAWINGS

The objects, features and advantages of the present invention will be apparent from the following detailed description in which.

DETAILED DESCRIPTION OF THE INVENTION

The present invention provides a method and apparatus for dividing a reference clock signal by a programmable divisor and outputting a resulting clock signal exhibiting nearly a 50/50 duty cycle. In the following detailed description, numerous specific details are set forth such as particular clock rates and register sizes in order to provide a thorough understanding of the present invention. It will be appreciated, however, to one of ordinary skill in the art, that the present invention may be practiced without such specific details. In other instances, well-known control structures and gate level circuits have not been shown in detail in order not to obscure unnecessarily the present invention. Particularly, many functions are described to be carried out by various logic circuits. Those of ordinary skill in the art, having been described the various functions, will be able to implement the necessary logic circuits without undue experimentation.

Figure 1:
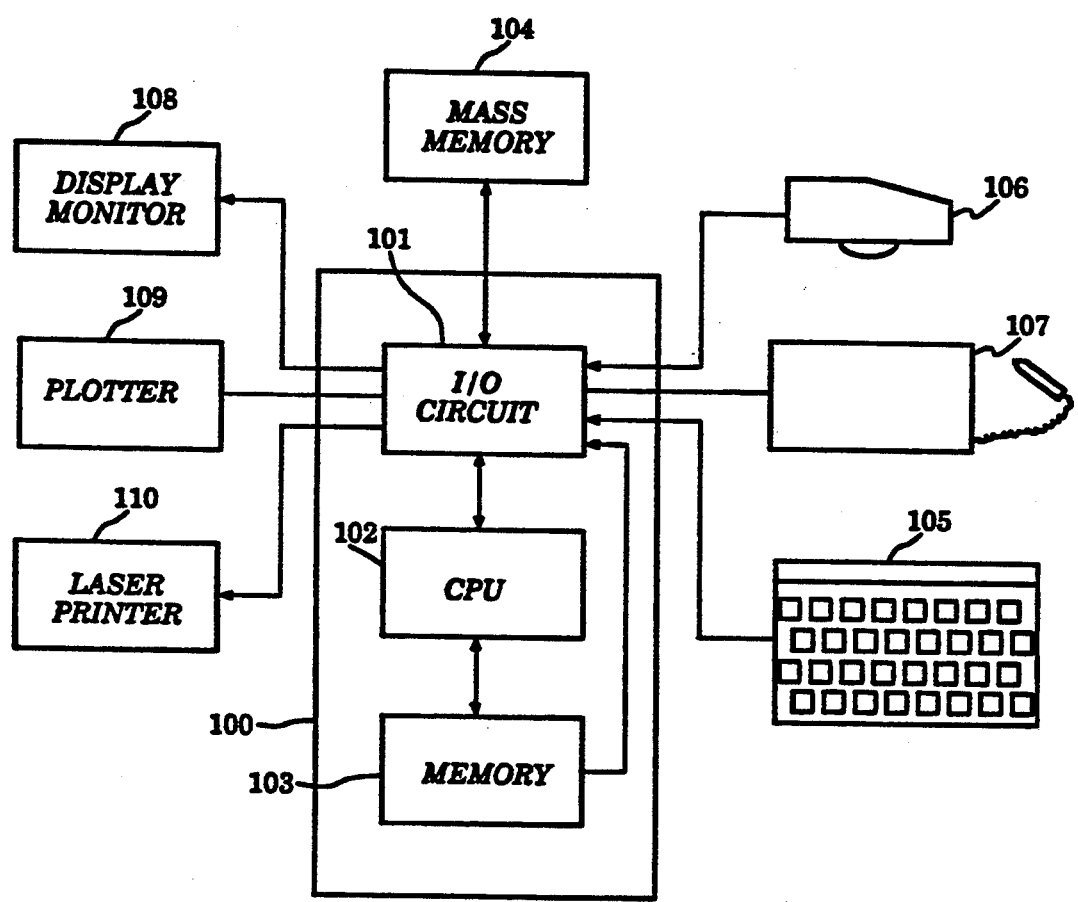
FIG. 1 illustrates a basic computer architecture which may incorporate the present invention.

Referring first to FIG. 1, a typical computer system which may utilize a microprocessor that implements the present invention is illustrated. As shown in FIG. 1, there is computer 100 which comprises three major components. The first of these is the input/output (I/O) circuit 101 which is used to communicate information in appropriately structured form to and from other parts of the computer 100 as well as out of the computer 100. Also shown as part of the computer 100 is the central processing unit (CPU) 102 and memory 103. These two latter elements are those typically found in most general purpose computers and almost all special purpose computers. In fact, the several elements contained within computer 100 are intended to be representative of this broad category of data processor. Many commercially available computers having differing capabilities may be utilized which incorporate the present invention. The CPU 102 may incorporate the programmable divider of the present invention in its timing module or elsewhere or the present invention may be incorporated at the interface of other components.

Also shown in FIG. 1 is an input device 105, shown in a typical embodiment as a keyboard. There is also shown as an input device a graphics tablet 107. It should be understood, however, that the input device may actually be in any other well-known input device (including, of course, another computer). A mass memory device 104 is coupled to I/O circuit 101 and provides additional storage capabilities for the computer 100. The mass memory may include other programs, fonts for different characters and the like and may take the form of magnetic or optical disc drive or any other well-known device. It will be appreciated that the data retained within mass memory 104, may, in appropriate cases, be incorporated in standard fashion into computer 100 as part of memory 103.

In addition, three typical computer display devices are illustrated, the display monitor 108, the plotter 109 and a laser printer 110. Each can be used to display images or documents or other data utilized by the computer 100. A cursor control device 106, such as a mouse, trackball or stylus are also coupled to I/O circuit 101. Other pointing devices may suitably be used as appropriate.

Figure 2:
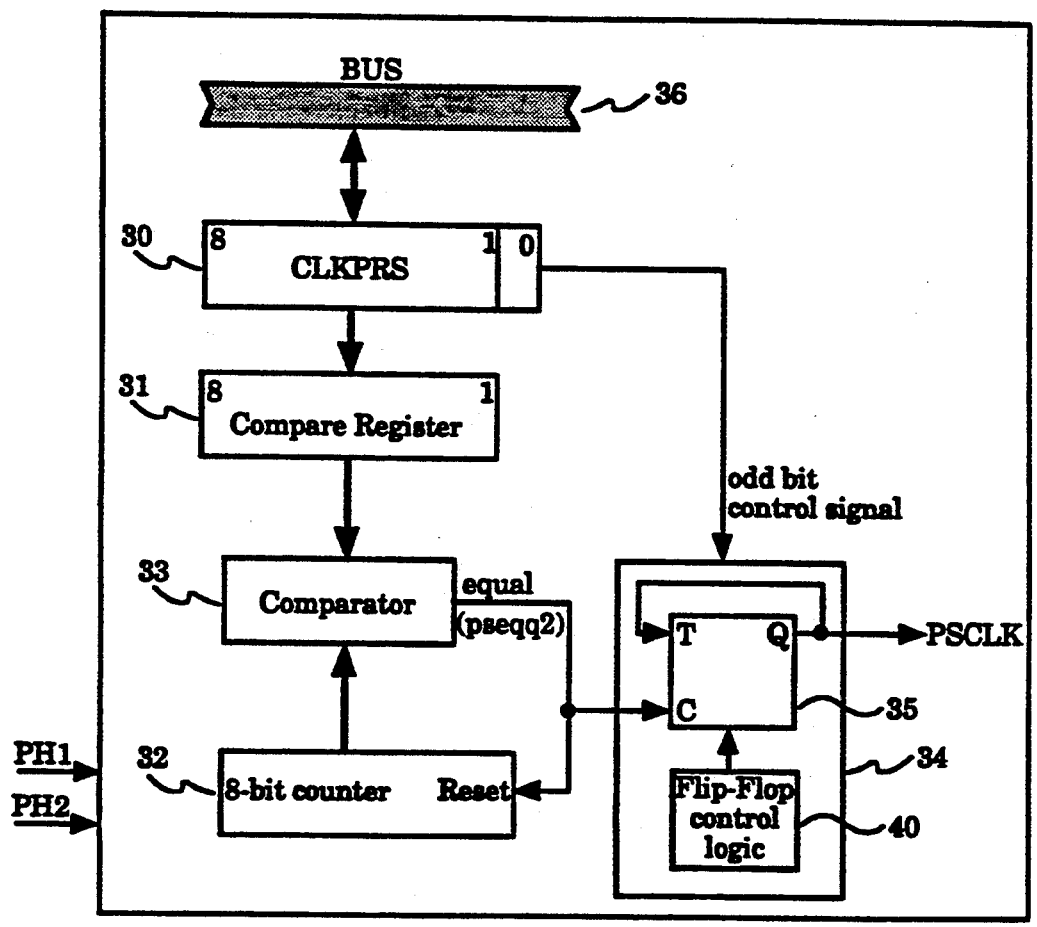
FIG. 2 illustrates the programmable divider circuitry block diagram according to a preferred embodiment of the present invention.

Referring now to FIG. 2, a block diagram of the programmable divider in accordance with a preferred embodiment of the present invention is illustrated. One of the motivations for the present invention was to be able to take a fast oscillating system reference clock to be able to drive the Intel 8254 timer module which operates at the 1.19 MHz DOS frequency without requiring an additional clocking crystal. The preferred embodiment of the present invention has, therefore, been designed to provide programmable division from a divide-by-2 to divide-by-513. This is done by limiting the number of bits in a clock prescale storage divide register as well as the number of bits in the width of the counter. These values are of course somewhat arbitrary and may be extended depending on the particular implementation desired. One consideration that must be taken into account in providing for larger division is the performance and clock speed of the circuit and whether or not the counter can keep up with the system reference clock.

The programmable divider is provided with a register 30. This register is the clock prescale register, referred to as CLKPRS. This register may be one of the systems standard registers or may be incorporated directly into a module housing the programmable divider. It is in this register that a programmed value is stored. The programmed value should be two less than the desired divisor. Thus:

$$Divisor = (programmed\ value) + 2$$

By storing all zeroes in the clock prescale register 30, the programmable divider will perform a divide-by-2. In the preferred embodiment of the present invention, only the first 9 bits of the prescale clock register are used. This provides for a stored value up to 511 or a programmed division by 513.

The least significant bit of the clock prescale register 30 indicates whether the divisor is odd or even and is used to provide an odd bit control signal to be described further herein. All even divisors will have a 0 in the least significant bit while all odd divisors will have a 1 in the least significant bit. A different bit may be used to indicate an odd/even divisor, but the above formula would have to be adjusted accordingly.

At this point, it is worth discussing the clocking signals to which a programmable divider is timed. FIG. 2 illustrates the programmable divider as receiving input clock signals PH1 and PH2. The PH1 and PH2 clock signals are generated from the systems clocking module. In the preferred embodiment and in most general microprocessor implementations, a crystal oscillator is implemented for generating a clock signal at a first frequency. Logic and analog circuitry are used to generate from this oscillator created clock signal the two signals, PH1 and PH2 which oscillate at half the frequency of the crystal oscillator and are themselves 180° out of phase with each other. Thus, when PH1 exhibits a high state, PH2 is in a low state and vice versa. Though it is not shown in FIG. 2, in the preferred embodiment each of the components of the programmable divider receive both the PH1 and PH2 signals.

During operation, the value stored in the clock prescale register 30 is loaded into a compare register 31. In actuality, bits 1-8 are loaded into the compare register while the 0-bit is provided to the odd-even control logic to be described further herein. A loading of the stored register value into the compare register 31 will only happen upon a certain condition which will be described with respect to the overall operation of the present invention.

On the same signal that causes the prescaled divisor to be loaded into the compare register 31, an 8-bit counter 32 begins counting on each clock cycle. This counter increments for each cycle of the clock. During each cycle, the value of the counter is compared to the value stored in the compare register 31. This comparison is carried out by comparator logic 33. When the value in the counter matches the value in the compare register, the comparator 33 sends an active equivalence signal indicating a positive comparison, this active signal being indicated as pseqq2. This equivalent signal is propagated to the flip-flop control block 34. The flip-flop control block 34 comprises a basic flip-flop 35 as well as the flip-flop control logic 40. The flip-flop control block 34 also receives the odd-even control bit from prescale clock register 30.

Figure 4:
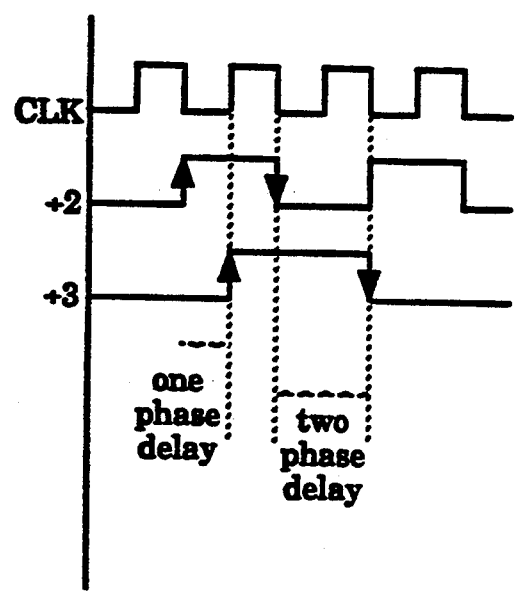
FIG. 4 illustrates a timing diagram showing the clocking characteristics of the present invention.

The output of the programmable divider of the present invention is propagated to the flip-flop 35. The prescale clock output (PSCLK) is toggled from high to low and low to high every time the value in the counter equals the value in the compare register. Some delaying of the toggling is implemented when an odd division is carried out because the equal signal from the comparator 33 has actually been sent as though an even divide of one less than the odd divisor were being carried out. The amount of delay in toggling is different depending on whether the transition of the clock signal is from low to high or from high to low. As can be seen in FIG. 4 which illustrates a divide-by-two clock signal and a divide-by-three clock signal with reference to the system clock, the delay in a transition from low to high is for one clock phase while a delay of two phases is inserted for a transition from high to low.

The odd-even control logic will be described further herein with respect to FIG. 3. With respect to FIG. 2, though it can be stated that the output signal PSCLK which toggles approximately every time the compare register value equals the 8-bit counter value will exhibit a 50/50 duty cycle for both odd and even divisions and will have clock edges coinciding with the system's reference clock.

When the value in counter 32 equals the stored value in compare register 31, in addition to signaling the flip-flop control logic 34 of equivalence, the comparator output and control logic also causes the counter to reset and begin counting from zero again until another match with the value stored in the compare register 31 occurs. Additionally, PSCLK and pseqq2 are provided to the compare register 31 for determining when the value stored in the prescale clock register 30 should be loaded into the compare register. The condition upon which a load to the compare register happens is when PSCLK reaches a low state simultaneous with an equivalence being determined by the comparator 33. Each time this condition is met the value in the prescale clock register 30 is loaded into the compare register 31. If the stored value in register 30 has not changed, the programmable divider continues to generate the same PSCLK output signal having a 50/50 duty cycle. If the value in the register 30 has changed, PSCLK will be shifted to exhibit the new programmable divide clock signal.

The reason a load from prescale clock register 30 to compare register 31 only happens upon equivalence at comparator 33 while PSCLK is in a low state is to prevent changing of the divide value midway through the generation of a previous divide. This ensures that the PSCLK clock edges are lined up with the PH1 and PH2 clock edges and prevents missing edges such that a smooth transition is made when changing from one divide-by value to another.

Also shown in FIG. 2 is a bus 36. This bus may be used to provide the desired value to the prescale clock register 30 from either software control or some other means for indicating a divide value. As was indicated, the programmable divide circuit may be implemented both in the same clocking module where the PH1 and PH2 clock signals are generated or at the interface of the component requiring a reduced clock signal.

Figure 3A:
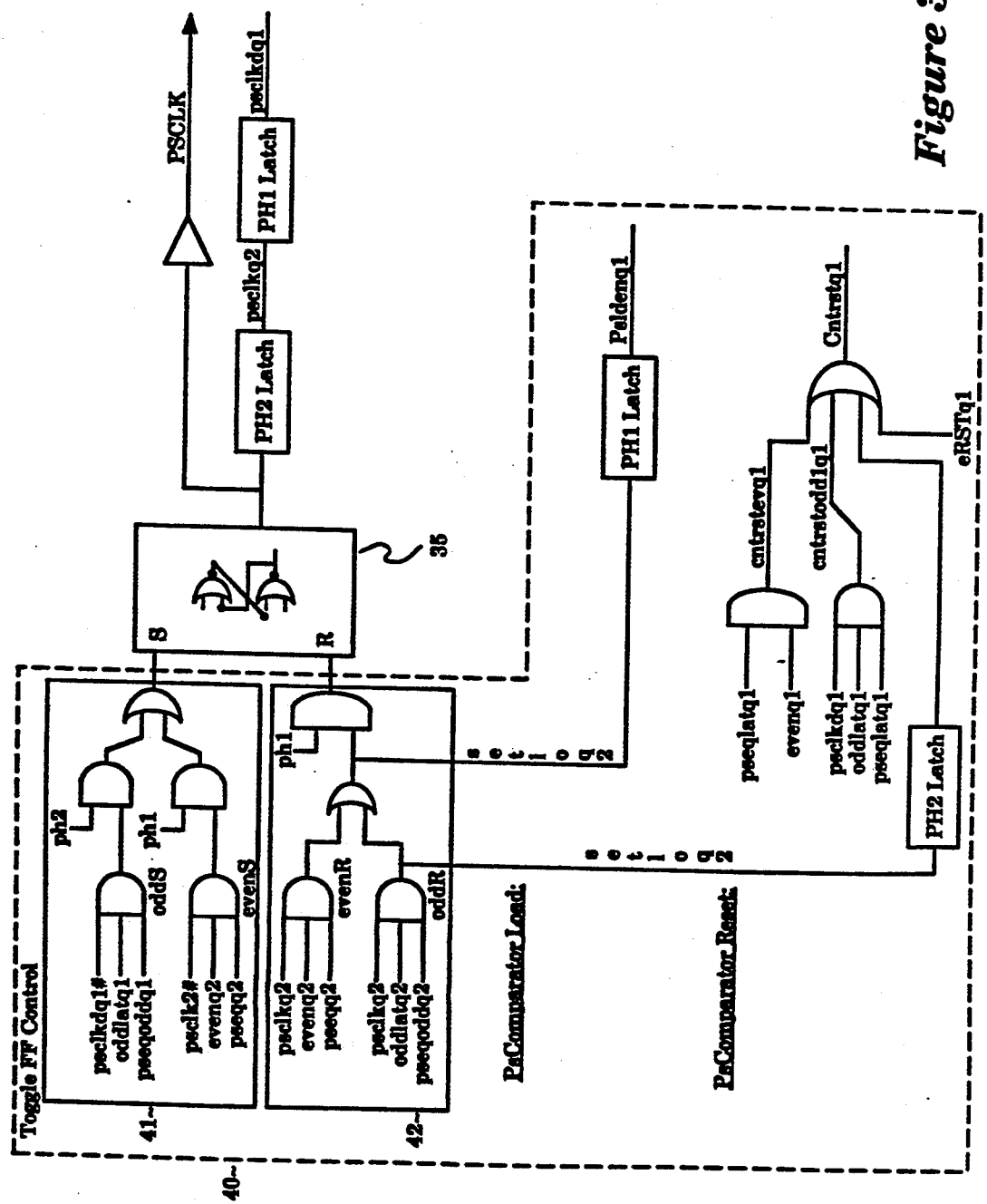
FIGS. 3 (*a*) and 3 (*b*) illustrate in more detail a portion of the control logic utilized in the present invention.
Figure 3B:
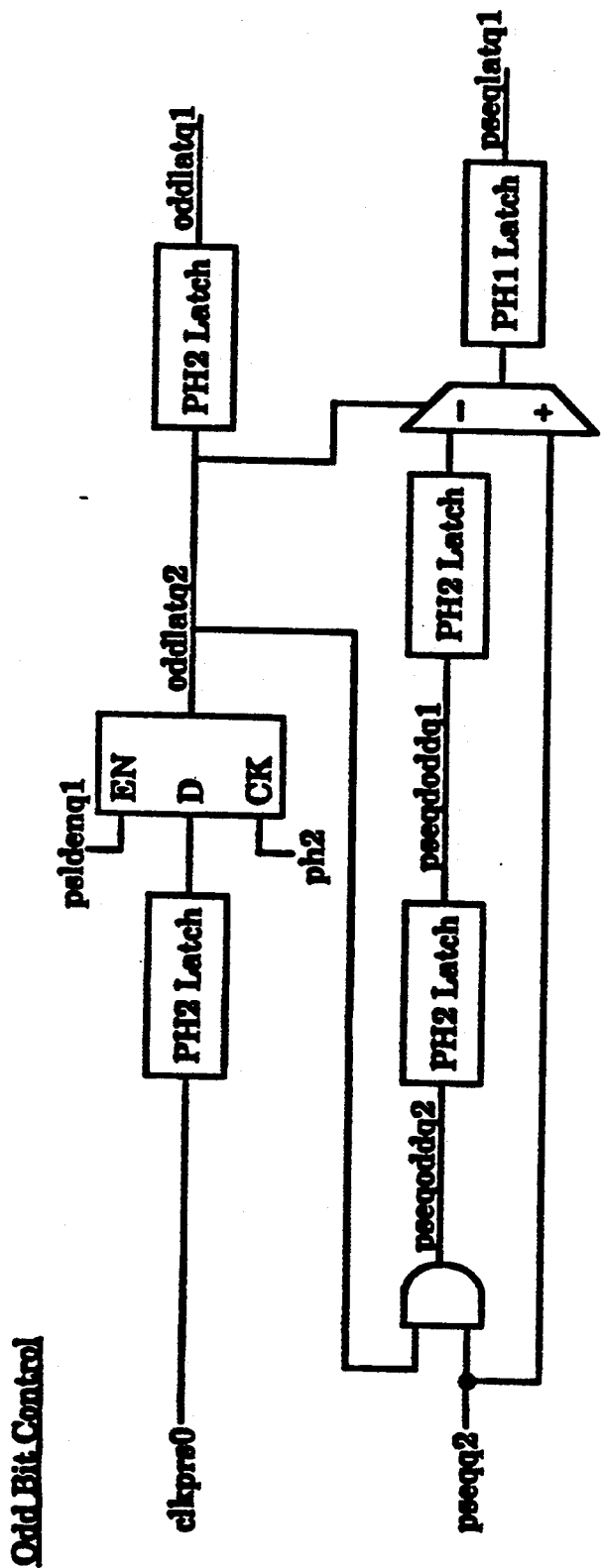

The details of the flip-flop control logic 30 will now be described in detail with reference to FIGS. 3(a) and 3(b). In FIG. 3(a) the control logic 40 is illustrated as providing the signals for toggling flip-flop 35, the output of which is the prescale clock signal PSCLK. Control circuitry 41 is used for switching the PSCLK signal from a low value to a high value while control logic 42 is used to toggle the flip-flop output from a high value to a low value. The logic 42 for toggling from a high value to a low value is also used to signal that the compare register 31 may be loaded from the prescale clock register 30 as well as for providing a reset signal to the counter 32. As was described, this ensures that new divisors are only loaded such that the PSCLK signal will have clock edges corresponding to the PH1 and PH2 clock signal edges.

It can be seen that the control circuitry 41 and 42 operate differently for even and odd divides. For even divides, the circuits trigger the toggling of flip-flop 35 directly upon receiving the pseqq2 signal from the comparator logic 33. However, for odd divides, a pseqoddq signal is required to trigger the toggling of flip-flop 35. The source of the pseqodd signals is generated by the odd bit control logic illustrated in FIG. 3(b). This control logic of FIG. 3(b) is responsive to an odd bit being in the least significant bit of the prescale clock register 30 indicating that an odd divide is being carried out. The purpose of the odd bit control logic is to add an additional increment of delay in toggling the flip-flop 35. The compare logic 33 (FIG. 2) will have activated the pseqq2 signal as though an even divide of one less than the desired odd divide were being carried out. The odd bit control logic adds an additional increment of division for an odd divide responsive to the odd bit control being set. The odd bit control logic effectively latches the equivalent signal for the amount of delay shown in FIG. 4 then provides a signal to the flip-flop toggle control logic 41 and 42 to provide for the toggling of flip-flop 35 and for controlling the correct timing for loads and resets of the compare and counter logic.

The preferred embodiment of the present invention is intended to operate in a system which incorporates the Intel 8254 timer module. The timer module operates at a frequency of 1.9318 MHz which is the DOS operating frequency. This circuit provides the ability of operating the timer module at the desired frequency when the internal clock frequency of the various processors are of different higher values. Table 1 below illustrates the values to be used in the prescale clock register 30 in order to convert various system clocks to the desired timer module operating frequency:

TABLE 1

| Oscillator frequency (MHz) | Internal freq (MHz) PH1 | Divisor value | Stored register value | PSCLK (MHz) |
|---|---|---|---|---|
| 33.40904 | 16.70452 | 0EH (14) | 0CH (12) | 1.19318 |
| 40.56812 | 20.18406 | 11H (17) | 0FH (15) | 1.19318 |
| 50.11356 | 25.05678 | 15H (21) | 13H (19) | 1.19318 |

There has thus been described a programmable divide circuit capable of performing both even and odd division and which generates an output clock cycle exhibiting a 50/50 duty cycle without the requirement of complicated or expensive analog circuitry. Various alternative embodiments will be apparent to those of ordinary skill in the art, such as providing for larger divisions by lengthening the compare register and counter bits. Likewise, alternative flip-flop control logic means may be implemented which are responsive to odd bit control signals but which still generate an output clock signal having a 50/50 duty cycle. Although the present invention has been described in terms of preferred and implemented embodiments, the various alternatives may be implemented by those of ordinary skill in the art without departing from the spirit and scope of the present invention. The invention should, therefore, be measured in terms of the claims which follow.

What is claimed is:

1. A computer system comprising:
    an input/output (I/O) means for providing a communications interface;
    a memory means coupled to said I/O means for storing instructions and computer data;
    data input means coupled to said I/O means for providing data input and data output to interface with a computer user; and
    microprocessor means coupled to said I/O means for executing instructions and processing computer data, said microprocessor means further comprising a means for generating a first clock signal for use by said computer system and a frequency divider for generating a second clock signal having a frequency equal to said first clock signal frequency divided by a selected divisor, said frequency divider comprising:
        a programmable storage register for receiving and storing a programmed value equal to said selected divisor minus two, said storage register being selectively programmable;
        a compare register in communication with said programmable storage register for being loaded by said programmable storage register upon a predetermined condition;
        an incremental counter responsive to said first clock signal, said incremental counter incrementing for each clock cycle of said first clock signal;
        a comparator coupled to said compare register and to said incremental counter for comparing the value in said compare register to the value in said counter, said comparator generating an equivalence signal to indicate when said values are equal; and
        a flip-flop circuit coupled to said comparator for generating said second clock signal, said flip-flop circuit toggling said second clock signal in response to said equivalence signal when it is generated by said comparator;
        flip-flop control logic coupled to said flip flop circuit for adjusting the timing of said toggling of said second clock signal when said divisor is an odd number, said flip-flop control logic being responsive to the least significant bit stored in said storage register,
        wherein said incremental counter is responsive to said equivalence signal and resets and begins counting again when said equivalence signal is generated by said comparator,
        and wherein said programmable storage register is responsive to said second clock signal and said equivalence signal, said predetermined condition for loading said compare register being that said equivalence signal is active at the same time said second clock signal is in a low state, thereby insuring that said second clock signal has clock signal edges approximately lined up with the clock signal edges of said first clock signal.

2. The computer system of claim 1 wherein said incremental counter is an eight bit counter and said comparator is an eight bit comparator.

3. In a computer system, the method of generating a second clock signal at a frequency equal to a first clock signal divided by a, selected divisor, said method comprising the steps of:
    storing in a first register a programmed value equal to said selected divisor minus two;
    loading a compare register with the programmed value in said first register;
    incrementing a counter for each cycle of said first clock signal;
    comparing the value in said compare register with the value in said counter;
    toggling a flip-flop circuit with an equivalence signal when the values in said counter and said compare register are equal;
    delaying by a predetermined amount said toggling step when said divisor is an odd number; and
    toggling the output signal from said flip-flop when said equivalence signal is received.

4. The method of claim 3 wherein said loading step occurs when said equivalence signal is sent to said flip-flop and said second clock signal is in a low state.

* * * * *